US007259109B2

(12) United States Patent
Meagley

(10) Patent No.: US 7,259,109 B2
(45) Date of Patent: Aug. 21, 2007

(54) ELECTROSPRAY AND ENHANCED ELECTROSPRAY DEPOSITION OF THIN FILMS ON SEMICONDUCTOR SUBSTRATES

(75) Inventor: Robert P. Meagley, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 290 days.

(21) Appl. No.: 10/947,016

(22) Filed: Sep. 22, 2004

(65) Prior Publication Data

US 2006/0267156 A1 Nov. 30, 2006

(51) Int. Cl.
*H01L 21/469* (2006.01)
*C23C 4/00* (2006.01)

(52) U.S. Cl. ...................... 438/778; 427/472; 427/483; 257/E21.487

(58) Field of Classification Search ................. 427/483
See application file for complete search history.

(56) References Cited

U.S. PATENT DOCUMENTS

| | | | | |
|---|---|---|---|---|
| 3,296,015 A * | 1/1967 | Juvinall et al. | ............. | 427/483 |
| 4,748,043 A * | 5/1988 | Seaver et al. | ............... | 427/482 |
| 5,585,426 A * | 12/1996 | Williams et al. | ............ | 524/366 |
| 6,060,128 A * | 5/2000 | Kim et al. | .................. | 427/483 |
| 6,331,330 B1 * | 12/2001 | Choy et al. | ................. | 427/475 |
| 6,544,599 B1 * | 4/2003 | Brown et al. | ............... | 427/475 |
| 2003/0226750 A1 * | 12/2003 | Fenn | .......................... | 204/164 |

OTHER PUBLICATIONS

Kim, Kyung Ho et al., *12.2: Large-Area Poly-Si on Glass by UV Scan Heating*, SID '02 Digest of Technical Papers, Boston, MA, May 19-23, 2002, pp. 150-153.

Kyung-Ha, Lee, *A Study on Laser Annealed Polycrystalline Silicon Thin Film Transistors (TFTs) with SiNx Gate Insulator*, Chapter 4, 1998, pp. 1-10, located at http:tftlcd.kyunghee.ac.kr/research/poly-Si/chapter4.html.

Tarraf, A. et al., *Stress Investigation of PECVD Dielectric Layers for Advanced Optical MEMS*, Journal of Micromechanics and Microengineering, vol. 14, Issue 3, Mar. 2004, pp. 317-323 (abstract only).

Bottrill, Andrew R., *Electrospray Ionisation (ESI)*, IFR and JIC Joint Proteomics Facility, 2000, pp. 1-4, located at http:/www.jic.bbsrc.ac.uk/services/proteomics/electrospray.htm.

Danek, M. et al., *Electrospray Deposition of Complex Molecules from Solution in UHV*, Dec. 4, 2003, pp. 1-3, located at http://www.nottingham.ac.uk/physics/research/nano/electrospray.htm.

Avseenko, N.V. et al., *Immunoassay with Multicomponent Protein Microarrays Fabricated by Electrospray Deposition*, Anal. Chem., vol. 75, No. 5, Mar. 1, 2002, pp. 927-933 (abstract only).

(Continued)

*Primary Examiner*—Stephen W. Smoot
(74) *Attorney, Agent, or Firm*—Laleh Jalall

(57) ABSTRACT

A method of forming a thin film on a substrate to fabricate a microelectronic device, a microelectronic device comprising a thin film deposited according to the method, and a system comprising the microelectronic device. The thin film may include on of a low k thin film, a thin film comprising photoresist, and a sacrificial polymer. The method comprises dispersing a precursor preparation into a spray of charged droplets through subjecting the liquid precursor preparation to electrostatic forces; directing the charged droplets to move toward the substrate; and allowing the charged droplets to generate a beam of gas-phase ions as the charged droplets move toward the substrate. The method further includes directing the gas-phase ions to impinge upon the substrate to deposit the thin film thereon to yield a deposited thin film on the substrate.

25 Claims, 4 Drawing Sheets

OTHER PUBLICATIONS

*Model for Electrospray Deposition on a Hot Plate*, Swiss Federal Institute of Technology Zurich, project description, Jul. 8, 2003, pp. 1-2, located at https://www.rdb.ethz.ch/projects/project.php?proj_id=7705&type=search&z_detailed=1&z_popular=1&z_keywords=1.

*Seed Project 2: Molecular Electrospray Deposition of Ferroelectrics*, Materials Research Science and Engineering Center at University of Wisconsin-Madison, project description, 1997, pp. 1-2, located at http://mrsec.wisc.edu/Past_projects/seedproj2/Seedproj2.html.

Kitching, K. J. et al., *Development of an Electrospray Approach to Deposit Complex Molecules on Plasma Modified Surfaces*, Review of Scientific Instruments, vol. 74, No. 11, Nov. 2003, pp. 4832-4839 (abstract only).

* cited by examiner

ELECTROSPRAY AND ENHANCED ELECTROSPRAY DEPOSITION OF THIN FILMS ON SEMICONDUCTOR SUBSTRATES

TECHNICAL FIELD

Embodiments of the present invention relate to the field of silicon processing, particular to a method of forming a thin film on a substrate, to microelectronic device including a substrate and a thin film deposited on the substrate, and to a system incorporating a substrate having a thin film deposited thereon.

BACKGROUND INFORMATION

Fabrication processes of integrated circuits typically involve various stages for depositing thin films of various materials on the surface of a semiconductor substrate. The preparation of such thin films typically includes such methods as evaporation, chemical vapor deposition (CVD) such as plasma enhanced chemical vapor deposition (PEVCD), sputtering, and spin casting. The above deposition schemes are conventionally used as appropriate to deposit metals, silicon, polysilicon, and dielectrics such as silicon dioxide and silicon nitride on the substrate. Typical PEVCD precursors include DMDMOS (dimethyldimethoxysilane), or TOMCATS (tetramethylcyclotetrasiloxane). PEVCD tends to be limited, however, in allowing engineering latitude with respect to resulting film characteristics and types of precursor materials.

Alternatively, thin films may be deposited using a spin-on ultra low-k dielectric material, such as LKD-5109, a methylsilsesquioxane (MSQ) material manufactured by the JSR Corporation. Although high yields are possible using an ultralow-k material, in some cases it has been necessary to use thicker passivation and an additional oxide layer on top of the structure to deliver a more mechanically stable stack, in this way driving up fabrication complexity and cost, and further leading to a deterioration of the dielectric constant of the resulting film stack by virtue of the additional oxide layer. Moreover, similar to PEVCD, the spin-on technique allows limited resulting characteristics (e.g. toughness).

Electrospray (ES) ionization, a CVD technology in which a conductive liquid is volatilized in transit to the growth front, is also known as a method for depositing molecules onto relevant surfaces. The deposition of pure complex molecules on semiconductor surfaces under ultra high vacuum conditions using ES to allow an exploration of the interaction of the deposited molecules with the surface and with each other is also known. ES is typically used as an ionization technique for mass spectrometry, especially for the analysis of compounds of biological significance. ES has also been used for the deposition of protein thin films, for the deposition of ceramic thin films, and for the deposition of ferroelectrics. ES has also been disclosed along with a pretreatment of a substrate with radio frequency (RF) plasma.

BRIEF DESCRIPTION OF THE DRAWINGS

In order to understand the manner in which embodiments of the present invention are obtained, a more particular description of the same will be rendered by referring to the appended drawings. The drawings are not necessarily to scale, and are not to be considered to be limiting in scope. In the appended drawings.

DETAILED DESCRIPTION

Embodiments of the present invention provide among others a novel method of forming a thin film, such as, by way of example and not limitation, a low k thin film, on a semiconductor substrate. In the following description, numerous specific details are set forth such as process steps, materials, dimensions, etc., in order to provide a thorough understanding of embodiments the present invention. However, it will be obvious to one skilled in the area that embodiments of the present invention may be practiced without these specific details.

Throughout the instant description, the term substrate includes not only a semiconductor substrate, but also any and all layers and structures fabricated over the semiconductor substrate up to the point of processing under discussion. For example, a "substrate" as referred to herein may include one or more structures such as active elements and passive elements including polysilicon gates, wordlines, source regions, drain regions, bit lines, bases, emitters, collectors, conductive lines, conductive plugs, diffusion regions, quantum dots, squids, etc.

In addition, as used in the instant description, "precursor preparation" refers to either a solution and/or suspension containing one or more precursors as applicable. "Precursor dispersion" refers to the dispersion of droplets and of gas-phase ions formed by virtue of the electrospray process.

Although the description that follows is focused primarily on low k thin film deposition, embodiments of the present invention encompass within their scope the use of ES or enhanced electrospray (EES) for the deposition of other types of thin films, such as, for example, high k dielectric materials, semiconductive materials, conductive and semiconductive organic materials, photoresists and sacrificial polymers to name just a few.

Current PEVCD precursor designs tend to be limited in allowing a deposition of low k dielectric layers that exhibits desirable physical and chemical properties. Low molecular weight (i.e. low $P_{vap}$) precursors typically used in PEVCD are limited in their structural complexity, thus allowing limited engineering latitude in PEVCD film characteristics resulting from their application. In particular, because PEVCD requires low molecular weight precursors suitable for vapor-phase processing, PEVCD resulting films have limitations with respect to their mechanical strength as well as to their dielectric constant.

Advantageously, embodiments of the present invention allow the use of precursors having larger molecular weights than those typically employed in PEVCD, including organic, inorganic and organometallic molecules and clusters, in this way making available a wider portfolio of precursors for film formation. Higher molecular weight precursors in turn allow the design of more structurally precise and complex thin films, enabling further engineering latitude with respect to the properties of the films to be deposited.

Figure 1:
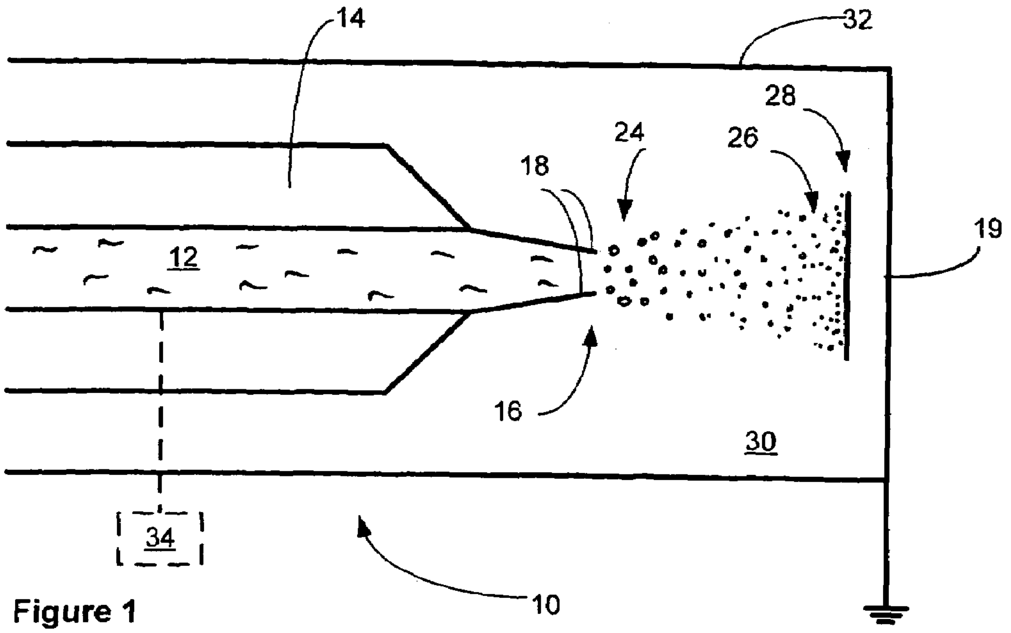
FIG. 1 is a schematic view of an electrospray thin film deposition device (ETFDD) during deposition according to an embodiment of the present invention showing the device in operation.

Referring now to the figures, in an electrospray thin film deposition device ETFDD according to embodiments of the present invention, such as in ETFDD 10 depicted in FIG. 1, a precursor preparation 12 is supplied at a controlled rate to a capillary tube 14 having a small-diameter tip 16 held at high potential by the presence of electrodes 18 positioned at the tip 16. A counter-electrode 19 in the form of a plate may be held at ground potential and attracts the precursor dispersion at the location of the substrate. Precursor preparation 12 may for example be supplied under a mild positive pressure (that is, a pressure sufficient to induce a flow of between 0.1 and 10 microliters per second) to the orifice of capillary tube 14 using an external pumping system. The high potential at tip 16 creates an electrostatic field that induces a surface charge in the liquid precursor preparation 12 emerging from tube 14. Electrostatic or "Coulomb" forces disperse the liquid into a fine spray 24 of charged droplets, which are accelerated and become a nanoscopic dispersion beam of gas-phase ions 26 before they reach the substrate 28 on which the low k thin film is to be deposited. The combination of droplets 24 and gas phase ions 26 will collectively be referred in the instant description as "precursor dispersion." Nanoscopic dispersion beam 26 is directed to impinge upon substrate 28 to form the low k thin film thereon. The ES deposition occurs in a vacuum setting, such as in a vacuum chamber 30 defined by a vacuum chamber housing 32 as would be recognized by a person skilled in the art. Optionally, according to an embodiment of the present invention, a part of capillary tube 14 may be heated with a conventional heat source 34 as shown in broken lines in FIG. 1. A heating of tube 14 tends to facilitate droplet evaporation according to application needs.

Figure 2:
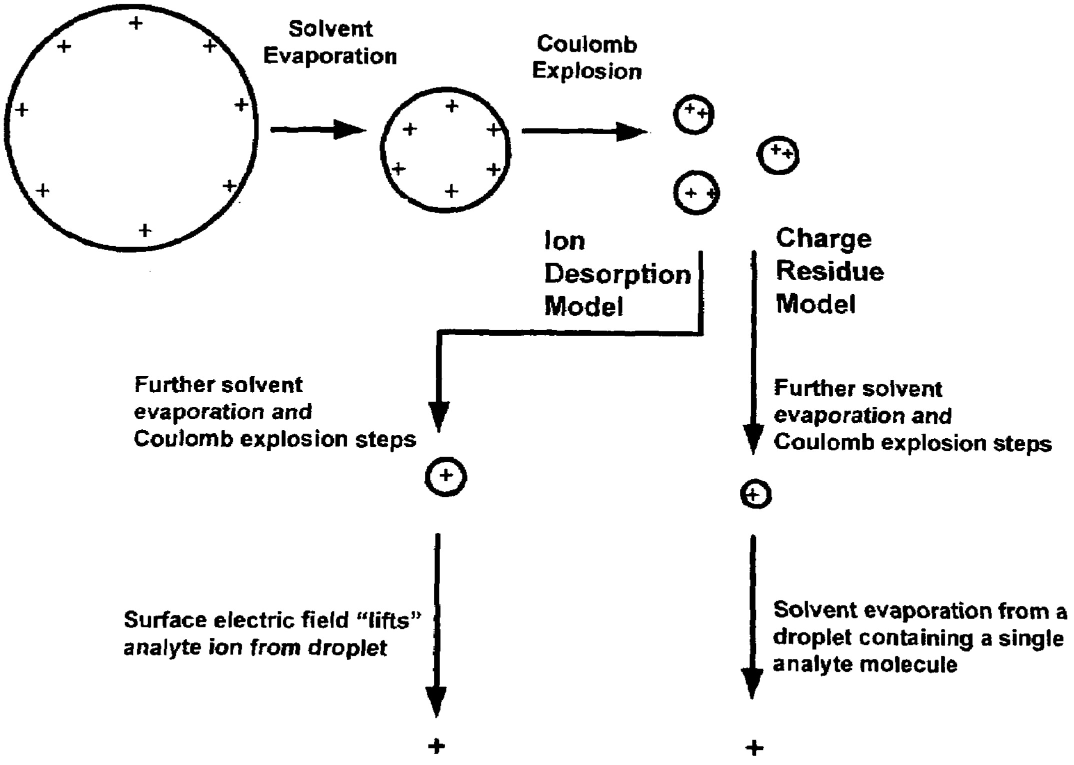
FIG. 2 is a diagram illustrating a charge residue model and an ion desorption model for the formation of solute ions from charges droplets during electrospray ionization.

As recognized by a person skilled in the art, electrospray techniques allow the possibility of generating gas-phase ions by spraying a solution from the tip of an electrically charged capillary. FIG. 2 is a diagram illustrating a charge residue model and an ion desorption model for the formation of solute ions from charges droplets during electrospray ionization, such as, for example, with ETFDD 10 shown in the embodiments of FIGS. 1, 4 and 5 (the embodiments of FIGS. 4 and 5 being described in further detail in the paragraphs below). FIG. 2 in fact shows the droplets during various stages of their transformation into gas-phase ions. In describing the features illustrated in FIG. 2, the instant description will make reference to ETFDD shown in FIG. 1, although it is to be understood that the principles sought to be depicted in the diagram of FIG. 2 apply to electrospray ionization in general. As shown in FIG. 2, to produce the spray, each droplet is charged near the Raleigh limit (at which point electrostatic repulsion overcomes surface tension). Within the capillary tube 14, the high potential charges the liquid emerging at the capillary tip 16, such that the liquid is dispersed into fine spray 24 of charged droplets. As solvent evaporates from each droplet, charge density on the droplet surface increases until the Rayleigh limit is reached. The resulting instability causes the droplet to disintegrate into smaller droplets. Thus, the charged liquid in the nozzle becomes unstable as it is forced to hold increasing charge, and blows apart into very small (typically less than 10 microns in diameter), highly charged droplets. These highly charged droplets rapidly shrink as solvent molecules evaporate from their surface, decreasing a distance between the electrical charges in each droplet. The above decrease in distance eventually results in the shrunken droplet to blow apart again. There is no consensus in the art as to the mechanism that leads to the formation of solute ions from the charged droplets. According to what is commonly known in the art as the "Charge Residue Model," eventually, the shrinkage and breaking apart of the droplets result in solute gas phase ions. According to what is commonly known in the art as the "Ion Desorption Model," a droplet shrinks until its surface electric field becomes large enough to lift an ion at the surface of the droplet over the energy barrier that prevents its escape. Id. In either case, a gas-phase ion is formed from the charged droplets, thus generating a nanoscopic dispersion beam such as nanoscopic dispersion beam 26 shown in FIG. 1. According to embodiments of the present invention, nanoscopic dispersion beam 26 is directed onto substrate 28 and is adsorbed thereon, in this way forming a low k thin film deposited on the substrate.

Optionally, according to embodiments of the present invention, the precursor dispersion obtained from ES, including droplets 24 and ions 26, may undergo enhanced activation, exciting the molecular orbitals of the gas phase molecules, promoting the electrons in the molecules to an excited state. When this state is high enough in energy to overcome bond enthalpy, bond scission occurs, creating a reactive intermediate. The reactive intermediate is then allowed to react with either the substrate 28 and/or with the molecules in the existing precursor dispersion to form new bonds. According to embodiments of the invention, enhanced activation of the precursor dispersion, may, for example, take the form of: (1) plasma activation; and (2) activation by irradiation. For example, species possessing moieties capable of absorbing radiation (such as, for example chromophores) may undergo excitation to reactive intermediates using enhanced activation by irradiation. In the case of plasma activation, the moiety expressed on the precursor species would be susceptible to interaction with plasma, for example, if it possessed bonds matched in energy to the plasma species of exposure. A description of each of the above exemplary forms of enhanced activation of the precursor dispersion is provided below in connection with FIGS. 1, 3 and 4.

An electrospray deposition which makes use of enhanced activation of the precursor dispersion according to embodiments of the present invention can be characterized as enhanced electrospray deposition, hereinafter referred to as "EES deposition." EES deposition advantageously allows additional control of deposition uniformity and rate, allowing modulation of layer formation.

Figure 3:
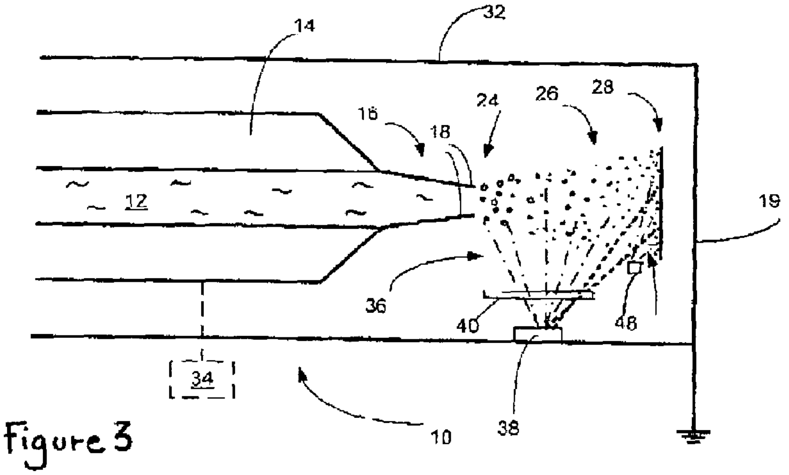
FIG. 3 is a schematic view of an ETFDD during deposition according to another embodiment of the present invention showing the device in operation.

Referring to FIG. 3, an ETFDD allowing EES through irradiation is illustrated according to an embodiment of the present invention. In FIG. 3, like elements have been indicated with reference numerals identical to those used in the ETFDD of the embodiment of FIG. 1. Here, in order to further activate the precursor dispersion made up of droplets 24 and of ions 26, irradiation 36 from a radiation source 38 is admitted to the chamber and directed toward the precursor dispersion. Preferably, irradiation 36 is admitted into the precursor dispersion region via a transparent window 40. By way of example, the transparent window could be a window made of quartz for 365-193 nm irradiation. According to embodiments of the present invention, by way of example and not limitation, irradiation types could include broad or narrow band UV (for example, Hg vapor arc, deuterium lamp, and laser), IR, electron beam, ion beam (for example, He, Ar, H, Si), and/or X-ray. The irradiation according to embodiments of the present invention could by way of example be a 337, 248 or 193 nm laser or electron beam delivered at between about 10 to about 10,000 Watts. Pulsed irradiation, such as, for example, a 337 nm, 100 Watt, 5 ns pulsed laser irradiation could also be used. Functionality of precursors subjected to enhanced activation involving irradiation would include groups that would photochemically fragment, such as, for example, triphenylsulfonium, or groups that would form radicals, such as, for example, benzophenone, or groups that form carbenes or nitrenes, such as, for example, groups having diazo or azide functionality.

Figure 4:
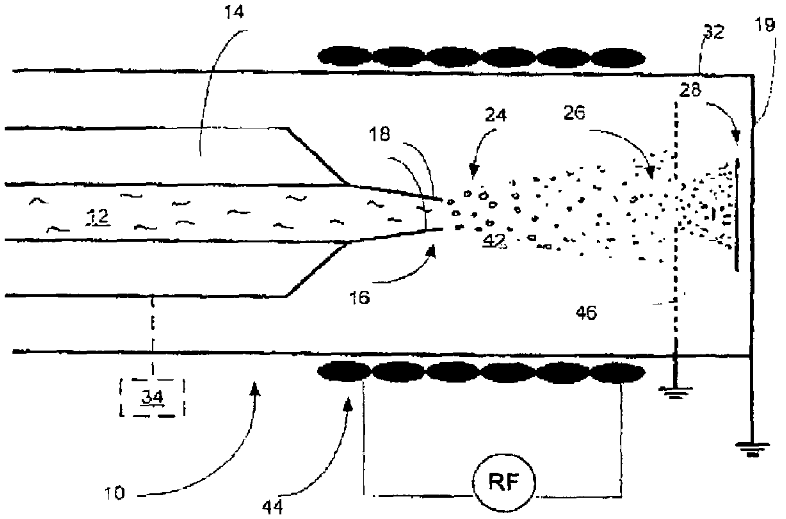
FIG. 4 is a schematic view of an ETFDD according to yet another embodiment of the present invention showing the device in operation.
Figure 5:
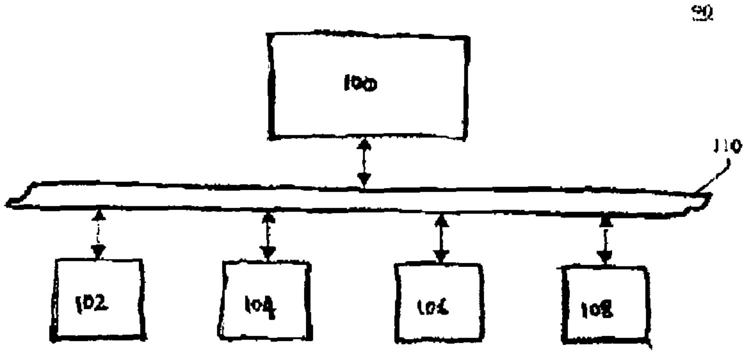
FIG. 5 is a schematic depiction of a system including a microelectronic device fabricated according to embodiments of the present invention.

Referring next to FIG. 5, an ETFDD allowing EES through plasma activation is illustrated according to an embodiment of the present invention. In FIG. 4, like elements have been indicated with reference numerals identical to those used in the ETFDD of the embodiment of FIG. 1. Here, in order to further activate the precursor dispersion made up of droplets 24 and of ions 26, an inductively coupled plasma region 42 may be created through the use of RF coils 44. Optionally, a collimator 46, preferably held at ground potential, may be used in the path of the precursor dispersion toward the substrate in order to focus the ionized molecular species and to allow additional control of deposition uniformity and rate. A frequency of plasma excitation for RF according to embodiments of the present invention could range from about 3 MHz to about 10 GHz, the range from about 10 to about 100 MHz being preferred for the excitation of HF plasma, and the range from about 1 GHz to about 10 GHz being preferred for the excitation of microwave plasma. In the alternative, embodiments of the present invention further include within their scope the use of a capacitively coupled plasma region for enhanced activation of the precursor dispersion.

Precursor preparations useful in embodiments of the present invention, such as the embodiments depicted in FIGS. 1, 3 and 4 could comprise species dissolved or suspended (such as a micro-emulsion, a colloid, etc) in an electrolyte fluid medium that undergoes ionization in an electrospray nozzle (such as the capillary and tip described above) to form a dispersion of molecular sized fragments. Precursor preparations useful in embodiments of the present invention could include, by way of example and not limitation, alicyclic cage hydrocarbons with silicon functional groups, siloxanes, oligo-siloxanes, silica nanoclusters, carbon nanoclusters (such as, for example, diamondoids and fullerines), and/or about 1% to about 25% by weight of molecular and molecular cluster feedstocks in a solution where the solvent includes alcohol, water, acetonitrille, dimethylformamide, DMSO, NMP and/or mixtures thereof. The alcohol could include, by way of example, methanol, ethanol, propane, or butane.

Additional functionality could facilitate binding, such as the functionality provided by groups susceptible to cross-linking (for example olefin or epoxide, aldehyde, sulfide, cyclopropane, ketone, oxetane, cyclobutene, acylsilane, silylhalide, acid halide, nitrille, etc.) Surfactant may be added from 1 ppb-1 ppt to disperse the precursor in the solvent and to provide electrolyte for ES. These surfactants could include hydrocarbon sulfonates, carboxylates and/or ammonium salts.

According to embodiments of the present invention, carrier gases used to maintain chamber pressure could include He, Ar, H2, Ne, N2, an H2/N2 mixture, methane, butane, nitrous oxide, and/or NH3.

Other process parameters useful in practicing a method according to embodiments of the present invention could include, by way of example and not limitation: a spray voltage (i.e. the potential applied between electrodes 18 and substrate 28 to induce the electrospray effect) of about 1000 to about 10000 Volts, with the rage between about 2000 and about 5000 Volts being preferred; a chamber pressure in the range between about 0.01 to about 10 Torr, with the range between about 0.1 to about 1 Torr being preferred; a chamber temperature between about 0 to about 600° C., with the range between about 20 to about 30° C. being preferred; plasma power, that is, the energy applied to the inductive or capacitive coupling between the deposition chamber and the radio frequency power supply (operational under the plasma enhanced condition) between about 1 to about 1000 Watts, with the range between about 50 to about 100 Watts being preferred; and a discharge tip having a diameter in the range between about 10 to about 500 microns.

According to an embodiment of the present invention, the substrate onto which one or more thin films according to embodiments of the present invention could be deposited could be subjected to enhanced activation during thin film deposition using well known plasma and/or radiation techniques similar to the ones described above with respect to enhanced activation of the precursor dispersion. Enhanced activation of the substrate would occur according to a mechanism similar to the one described above with respect to enhanced activation of the precursor dispersion. In this case, the deposited thin film would adsorb the energy from enhanced activation, resulting in the formation of reactive intermediates, which would in turn then react with either the substrate or with further precursors being deposited to form new bonds. The above would further induce film formation and allow control of the film morphology.

Referring again to FIG. 3, for example, irradiation source 38 could be adjusted to have variable angles of incidence in order to allow the irradiation of the precursor dispersion as shown, of the substrate (as shown by the thicker broken irradiation lines emanating from irradiation source 38 toward the substrate in FIG. 3), or of both the precursor dispersion and of the substrate (again as shown in FIG. 3). Optionally, an additional irradiation source 48 could be disposed in the vacuum chamber housing 32 in order to direct further radiation 50 toward the substrate 28 as shown in FIG. 3. The embodiment of ETFDD 10 shown in FIG. 3 would thus allow an irradiation of the precursor dispersion, an irradiation of the substrate, or an irradiation of both simultaneously during deposition. Optionally, the substrate could be subjected to patterned irradiation to activate preselected regions thereof according to application needs. In the alternative, the substrate may be subjected to enhanced activation during deposition using well known plasma techniques.

According to one embodiment, a multi-chamber process may be used as part of the electrospray technique mentioned above in order to optimize the characteristics of the deposited layers. For example, electrospray may be performed to deposit several separate layers in respective deposition chambers, the conditions of each chamber being optimized based on the desired characteristics of the layer to be deposited via electrospray within that chamber. In the alternative, a multi-chamber process could include electrospray deposition in one or more chambers as described above, followed by additional processing, such as etching back, in subsequent chambers. The latter is sometimes performed to toughen the resulting film or to render the same more uniform.

After deposition of the thin film as described for example with respect to the embodiments of FIGS. 1, 3 and 4, with or without enhanced activation of the precursor dispersion and/or substrate, various subsequent processing may be performed according to embodiments of the present invention. Optionally, the deposited thin film may undergo post-treatment to induce beneficial changes to the integration and performance of the deposited material. Post-treatment could include, for example, any of the following well-known techniques: (1) a removal of the hydrocarbon functionality of a hydrocarbon substituted silicon-based precursor (or "substituted precursor") to form a low k thin film with greater porosity and a lower dielectric constant; (2) skin formation and/or passivation that provide a relatively short penetration length of heat and/or radiation to densify a few angstroms of film thickness; and/or (3) backfilling with materials to fill pores, depending on a given application, although this third possible post treatment procedure would tend to reduce effectiveness with respect to the dielectric constant. However, the latter procedure could be useful according to the morphology of the deposited film.

According to embodiments of the present invention, removal of the hydrocarbon functionality of a substituted precursor may occur by either of the well known techniques of thermal decomposition of the substituted precursor, selective removal of the substituted precursor using solvents or supercritical carbon dioxide ($CO_2$), exposure to irradiation (electron-beam, X-ray, ultraviolet (UV), infrared (IR), microwave, or the like), or otherwise.

Referring next to FIG. 5, there is illustrated one of many possible systems in which embodiments of the present invention may be used. According to one embodiment of the present invention, system 90 includes electronic assembly 100 which in turn may include a microprocessor including a die having one or more thin films thereon, such as a low k thin film thereon, deposited according to embodiments of the present invention. In an alternate embodiment, the electronic assembly 100 may include an application specific IC (ASIC). Integrated circuits found in chipsets (e.g., graphics, sound, and control chipsets) may also be packaged in accordance with embodiments of this invention.

For the embodiment depicted by FIG. 5, the system 90 may also include a main memory 102, a graphics processor 104, a mass storage device 106, and/or an input/output module 108 coupled to each other by way of a bus 110, as shown. Examples of the memory 102 include but are not limited to static random access memory (SRAM) and dynamic random access memory (DRAM). Examples of the mass storage device 106 include but are not limited to a hard disk drive, a compact disk drive (CD), a digital versatile disk drive (DVD), and so forth. Examples of the input/output module 108 include but are not limited to a keyboard, cursor control arrangements, a display, a network interface, and so forth. Examples of the bus 110 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server. It may also be a sub system such as a video graphics card, a memory element (SD, MMC, Memory Stick, etc.), a microcontroller and a risk coprocessor.

Figure 6:
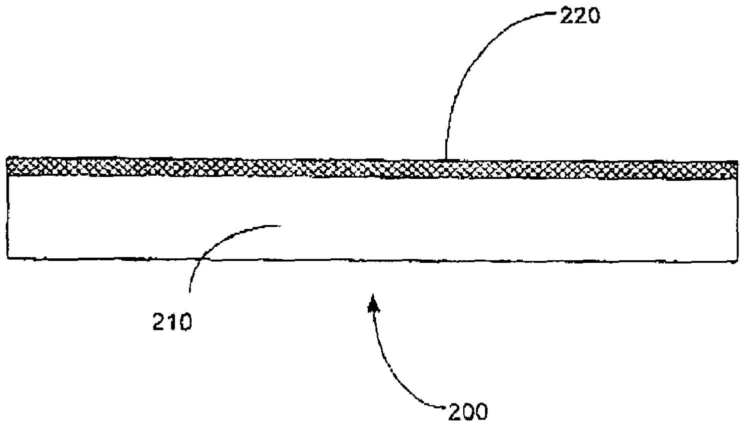
FIG. 6 is a schematic representation of a package for a microelectronic device, the package including substrate including a deposited thin film thereon according to an embodiment of the present invention.

Referring next to FIG. 6, a package 200 for a microelectronic device is shown comprising a substrate 210 and a thin film 220 adsorbed on the substrate according to embodiments of the present invention using ES or EES as described above. The thin film 220, according to embodiments of the present invention, exhibits a morphology reflecting a precursor preparation comprising at least one of inorganic clusters, organometallic clusters, and precursor molecules having a molecular weight above about 500 Daltons.

EXAMPLE

Figure 7:
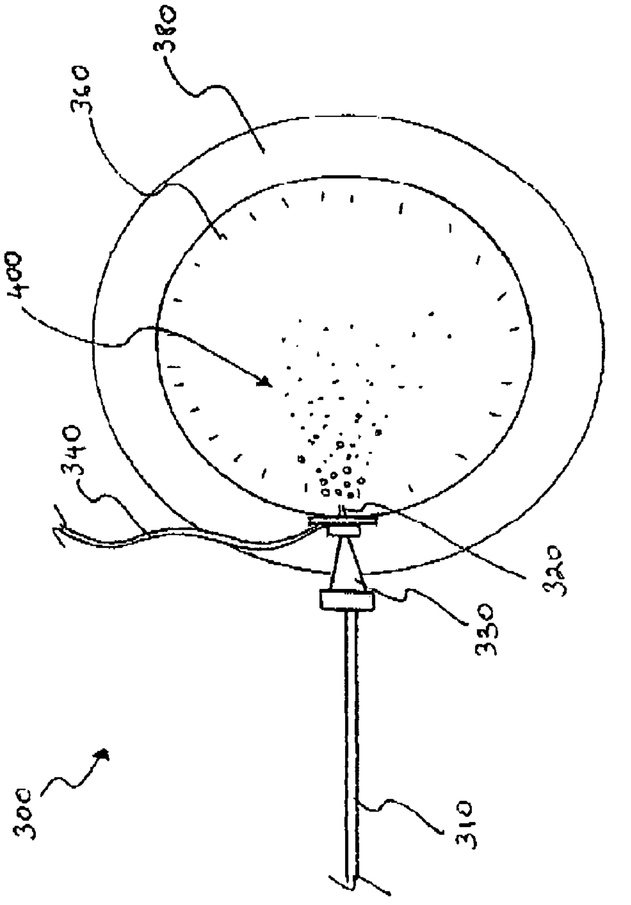
FIG. 7 is a schematic top view of an experimental ETFDD using principles according to an embodiment of the present invention.

Referring to FIG. 7, a prototype ETFDD was built and a coarse film of mixed ionic and anionic surfactants deposited on a substrate. The ES injector 300 used included a 10 microliter syringe 310, a stainless steel needle 320 having an orifice diameter of about 100 microns, a polyethylene sleeve 330 and a brass electrode 340. Plasma discharge centered around the injection orifice of the needle. The pressure of the glass chamber 360 was adjusted to about 1 Torr of air. Common detergent was feedstock as an aqueous solution of about 1%. Plasma 400 was formed in glass chamber 360 having a capacity of about 4 liters equipped with an aluminum bottom 380 and brass top electrodes energized at about 29 MHz with about 80 Watts of forward power with a standing wave ratio of 1.9:1 with capacitive coupling directly to the interior of the glass chamber. Electrospray was performed at about 2 kV with 100 micron diameter orifice (stainless) 10 microliter syringe interfaced with the chamber 360 through a silicone septum and polyethylene sleeve 330 inserted about the center of the top brass electrode.

The above experiment proved successful as long as ES flow rate was kept slow enough, that is, at about 1 microliter per 10 seconds in 0.5 microliter aliquots, to maintain pressure limits required to sustain the plasma. The experiment resulted in a water soluble surfactant film being formed on the glass substrate, positioned in the same manner as glass substrate 28 in FIGS. 1, 3 and 4.

The present invention has been described with reference to specific exemplary embodiments thereof. It will, however, be evident to persons having the benefit of this disclosure that various modifications and changes may be made to these embodiments without departing from the broader spirit and scope of the present invention. The specification and drawings are, accordingly, to be regarded in an illustrative rather than in a restrictive sense.

What is claimed is:

1. A method of forming a low k thin film on a substrate, comprising:

generating a precursor dispersion from a precursor preparation including:

dispersing the precursor preparation into a spray of charged droplets by subjecting the liquid precursor preparation to electrostatic forces;

directing the charged droplets to move toward tne substrate; and allowing the charged droplets to generate a beam of gas-phase ions as the charged droplets move toward the substrate, the precursor dispersion including the charged droplets and the gas phase ions; and directing the gas-phase ions to impinge upon the substrate to deposit the thin film thereon to yield a deposited thin film on the substrate.

2. The method of claim 1, wherein dispersing comprises:

flowing the precursor preparation in a capillary tube having a tip at a discharge end thereof;

disposing electrodes at the tip to apply a potential to the precursor preparation emerging from the tip to subject the precursor preparation to the electrostatic forces at the tip;

discharging the precursor preparation from the tip as the spray of charged droplets;

directing the charged droplets and directing the gas-phase ions comprise disposing a counter-electrode at a location of the substrate held at a potential different from the potential applied to the electrodes to attract the gas-phase ions in a direction toward the substrate.

3. The method of claim 1, further comprising subjecting the precursor dispersion to enhanced activation during thin film deposition.

4. The method of claim 3, wherein subjecting the precursor dispersion to enhanced activation comprises at least one of: irradiating the precursor dispersion and subjecting the precursor dispersion to a plasma region.

5. The method of claim 4, wherein the plasma region is one of inductively coupled and capacitively coupled.

6. The method of claim 4, wherein irradiating comprises irradiating the precursor dispersion using at least one of: broad or narrow band UV radiation, IR radiation, electron beam radiation, ion beam radiation, and X-ray.

7. The method of claim 6, wherein irradiating the precursor dispersion using broad or narrow band UV radiation comprises irradiating the precursor dispersion using at least one of an Hg vapor arc, a deuterium lamp and a laser source.

8. The method of claim 6, wherein irradiating the precursor dispersion using ion beam radiation comprises irradiating me precursor dispersion using at least one of a He, an Ar, an H and a Si ion beam.

9. The method of claim 4, wherein irradiating the precursor dispersion comprises irradiating with at least one of a laser beam and an electron beam delivered in a range between about 10 to about 10,000 Watts.

10. The method of claim 4, wherein irradiating the precursor dispersion comprises using Pulsed irradiation.

11. The method of claim 4, wherein irradiating the precursor dispersion comprises irradiating a precursor dispersion generated from precursors having a functionality including at least one of groups susceptible to photochemical fragmentation, groups susceptible to forming radicals, an a groups susceptible to forming carbenes or nitrenes.

12. The method of claim 4, wherein subjecting the precursor dispersion to an inductively coupled plasma region comprises using RF coils to generate the plasma region.

13. The method of claim 4, wherein subjecting the precursor dispersion to an inductively coupled plasma region comprises using a collimator in a path of the precursor dispersion toward the substrate to control a deposition of the thin film on the substrate.

14. The method of claim 4, wherein subjecting the precursor dispersion to an inductively coupled plasma region comprises generating a frequency of plasma excitation ranging from about 3 MHz to about 10 GHz.

15. The method of claim 4, wherein the plasma is one of HF plasma generated at a frequency ranging from about 10 MHz to about 100 MHz, and a microwave plasma generated at a frequency ranging from about 1 GHz to about 10 GHz.

16. The method of claim 4, comprising simultaneously irradiating the precursor dispersion and subjecting the substrate to enhanced activation by irradiating the substrate.

17. The method of claim 4, wherein irradiating the substrate comprises subjecting the substrate to patterned irradiation.

18. The method of claim 1, wherein the precursor preparation includes at least one of: alicyclic cage hydrocarbons with silicon functional groups, siloxanes, oligo-siloxanes, silica nanoclusters, and carbon nanoclusters.

19. The method of claim 1, wherein the precursor preparation includes at least one of: a solution of about 1% to about 25% by weight of molecular and molecular duster feedstocks in a solvent including at least one of alcohol, water, acetonitrille, dimethylformamide, DMSO, NMP.

20. The method of claim 1, wherein the precursor preparation exhibits a functionality provided by groups susceptible to cross-linking.

21. The method or claim 1, wherein the precursor preparation includes a surfactant to disperse precursors in a solvent of the precursor preparation and to provide electrolyte for the precursor preparation.

22. The method of claim 1, further comprising subjecting the deposited thin film to post-treatment after deposition of the thin film on the substrate.

23. The method of claim 22, wherein post-treatment comprises at least one of: removing a hydrocarbon functionality of a hydrocarbon substituted silicon-based precursor in the thin film; subjecting the thin film to skin formation; subjecting the thin film to passivation; and bsckfilling the thin films with materials to fill pores in the thin film.

24. A method of forming a thin film on a substrate to fabricate a microelectronic device, comprising:

generating a precursor dispersion from a precursor preparation including:

dispersing the precursor preparation into a spray of charged droplets by subjecting the liquid precursor preparation to electrostatic forces;

directing the charged droplets to move toward the substrate; and allowing the charged droplets to generate a beam of gas-phase ions as the charged droplets move toward the substrate, the precursor dispersion including the charged droplets and the gas phase ions; and directing the gas phase ions to impinge upon the substrate to deposit the thin film thereon to yield a deposited thin film on the substrate.

25. The method of claim 24, wherein the thin film is one of a low k thin film, a thin film comprising photoresist, and a thin film comprising a sacrificial polymer.

* * * * *